Feb. 25, 1958 J. I. PANKOVE 2,824,977

SEMICONDUCTOR DEVICES AND SYSTEMS

Filed Dec. 24, 1954 2 Sheets-Sheet 1

INVENTOR.
JACQUES I. PANKOVE
BY J. C. Whittaker
ATTORNEY

INVENTOR.
JACQUES I. PANKOVE
BY J. L. Whittaker
ATTORNEY

United States Patent Office 2,824,977

Patented Feb. 25, 1958

2,824,977

SEMICONDUCTOR DEVICES AND SYSTEMS

Jacques I. Pankove, Princeton, N. J., assignor to Radio Corporation of America, a corporation of Delaware Application December 24, 1954, Serial No. 477,494

6 Claims. (Cl. 307—88.5)

This invention relates generally to semiconductor signal translating and delay or storage devices and systems, and particularly to improved methods and apparatus employing semiconductor elements.

Presently known semiconductor devices and, in particular, semiconductor signal delay and storage switching devices include a semiconductor crystal in the form of a filament or the like having a finite length. Thus the length of the path traversed by charge carriers in the crystal and the time delay experienced by these charge carriers between an input and an output electrode is determined by the length of the current flow path in the filament and has a maximum limiting value determined by the length of the filament. The time delay between input and output signals in such devices may be varied by changing the magnitude of an applied electric field or by changing by other means the effective length of the current flow path between input and output electrodes. The input and output electrode spacing is limited by the length of the semiconductor crystal which may be varied to a certain extent to obtain different time delays. However, semiconductor devices are desirable for their small size. Thus, to obtain a comparatively long time delay, neither changing the electric field nor the length of the semiconductor crystal is a complete solution. In addition, in conventional semiconductor devices, separate input and output electrodes are employed for applying an input signal and providing an output signal, respectively.

Accordingly, an important object of this invention is to provide a semiconductor device and system of new and improved form.

Another object is to provide improved methods of and means for employing semiconductor current translating elements.

Another object of this invention is to provide an improved semiconductor time delay and switching device.

A further object of the invention is to provide an improved semiconductor switching device and system having controllably variable time delay.

Another object of the invention is to provide an improved method of obtaining controllably variable time delay between input and output signals in a semiconductor device.

Still another object of the invention is to provide an improved method of and apparatus for utilizing a single rectifying electrode as both an input and output electrode for a semiconductor device.

The principles and objects of the invention are accomplished in apparatus including a semiconductor crystal defining a closed loop current flow path wherein the input and output electrodes comprise a common rectifying element. The crystal may be in the form of a ring or the like and has a base electrode and a common rectifying electrode. The rectifying electrode is biased alternately into carrier-injecting and carrier-collecting states and comprises the starting point and terminus for signal currents flowing in the loop path. When biased in the injecting state, the rectifying electrode injects charge carriers into the crystal and a field electromagnetically induced in the crystal is employed to sweep the charge carriers around the crystal. At some desired instant after the charge carriers have been injected, the bias on the rectifying electrode is reversed, and the electrode is switched into the current-collecting condition, whereby the charge carriers circling around the ring are collected and an output signal is derived therefrom and applied to appropriate circuit connections. This construction provides an electric field in a semiconductor body without requiring auxiliary electrodes in contact with said body. The time delay between injection and collection may be altered in many ways, for example, by varying the length of the current flow path, by varying the intensity of the induced field, and by varying the relative instants at which the rectifying electrode is switched into the current injecting and collecting states.

The bias switching of the rectifying electrode may be accomplished, for example, by a switching circuit coupled thereto and energized by pulses from the electric field-inducing circuit. The energizing pulses are appropriately synchronized with the sweep of the electric field around the semiconductor crystal.

The invention is described in greater detail by reference to the accompanying drawing in which similar reference characters refer to similar elements and wherein.

Figure 1:
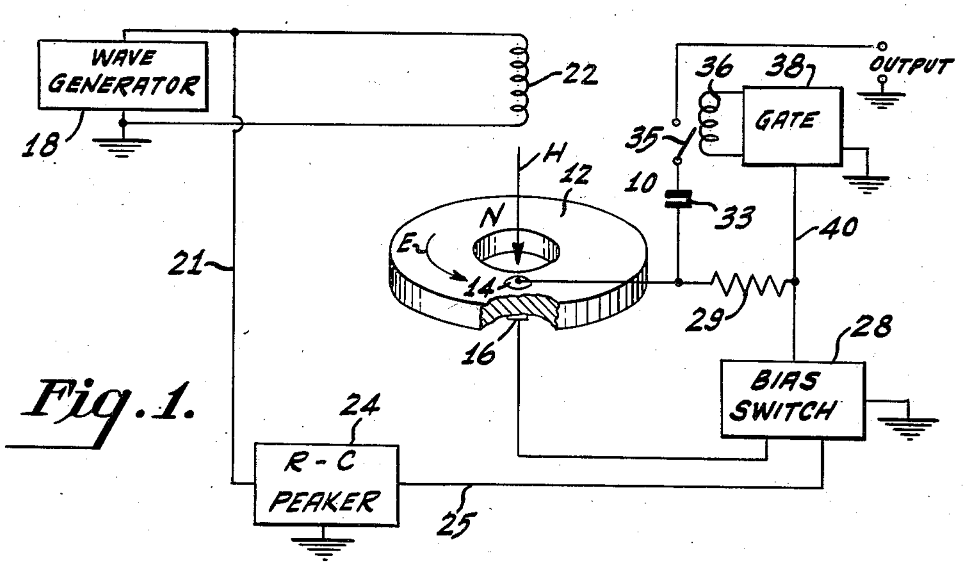
Fig. 1 is a perspective view of a device embodying the principles of the invention and a schematic diagram of a circuit in which it may be operated.

Referring to the drawing, a semiconductor device 10 embodying the principles of the invention comprises a body or crystal 12 of semiconductor material, for example, germanium, silicon, or the like, of N-type or P-type conductivity. For purposes of illustration, the crystal 12 will be assumed to be N-type germanium. The crystal 12 is in the form of a ring or may take substantially any shape which provides a closed loop flow path for charge carriers.

A rectifying electrode 14 is provided in contact with the crystal 12 and may be a surface barrier type electrode in the form of a whisker or it may be a comparatively large-area surface plate or film. The rectifying electrode 14, alternatively, may comprise a P–N junction electrode, for example, of the type formed by an alloying or fusion process such as described in an article entitled "A Developmental Germanium P–N–P Junction Transistor" by Law et al. in the Proceedings of the IRE of November 1952 (page 1352). A base electrode 16 is connected in ohmic (non-rectifying) contact with the crystal 12.

Figure 2:
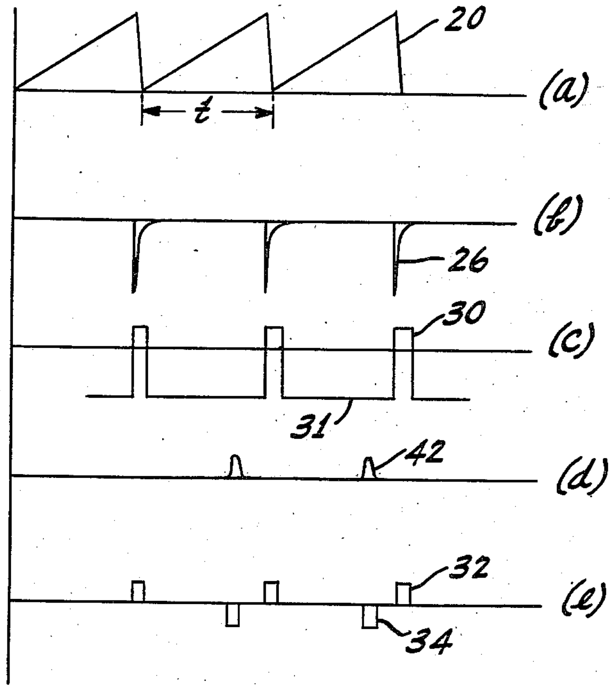
Fig. 2 is a representation of various voltage waves which may be utilized in the circuit of Fig. 1, said curves being shown on the same time axis.

A typical circuit employed for switching operation of the device 10 includes electromagnetic means for providing a field in the crystal 12 for sweeping charge carriers around the body of the crystal. The sweeping field is provided by a wave or signal generator circuit 18 for producing, for example, a sawtooth wave 20 (Fig. 2*a*), and connected to a solenoid 22. Such a sawtooth voltage generator may be of the type shown on pages 2–21 of "Principles of Radar" published by McGraw-Hill Book Company (second edition) 1946. The solenoid 22 is oriented to provide a varying magnetic field in the direction of the arrow H along the axis of the ring 12 whereby an electric field, for example in the direction of the arrow E, is induced in and sweeps around the ring. The output of the generator 18 is also connected by a lead 21 to a differentiating or R-C peaker circuit 24 which converts the sawtooth waves 20 to sharp and narrow triggering pulses 26 (Fig. 2*b*). A typical differentiating circuit is shown on pages 2–27 of the above-identified publication.

The output of the R-C peaker 24 is coupled by a lead 25 to a bias switching circuit 28 which is connected between the rectifying electrode 14 and the base electrode 16 of the semiconductor device 10. A load impedance, for example a resistor 29, is connected between the switch circuit 28 and electrode 14. The bias switching circuit 28 may be of the type described on pages 247–253 of the book "Waveforms," volume 19 of the Radiation Laboratory Series published by McGraw-Hill Book Company (1949). The circuit 28 provides a wave (Fig. 2*c*) having positive portions 30 extending over a predetermined time during which the electrode 14 injects minority charge carriers into the crystal. The wave of Fig. 2*c* also includes negative portions 31 extending over a predetermined time during which the rectifying electrode 14 is biased in the reverse direction with respect to the crystal 12 and, accordingly, is biased to operate as a collector electrode. The trigger pulses 26 from the differentiating circuit 24 are applied to the bias switching circuit 28 to initiate the generation of the positive charge injection portions 30 of the bias signal applied to the electrode 14. The differentiating circuit 24 is synchronized with the generator 18 so that the electrode 14 is triggered into the injecting state at substantially any desired time with respect to the sawtooth wave 20.

The end of the resistor 29 adjacent to the electrode 14 is connected to a coupling capacitor 33 which is connected through a switch 35 controlled by a solenoid 36 to a suitable output circuit. The solenoid 36 is connected to a gate circuit 38 which is connected in turn by a lead 40 to the switch circuit 28. The gate circuit may be of the type shown in Fig. 4.11 of volume 5, "Pulse Generators" of the Radiation Laboratory Series published by McGraw-Hill in 1948 wherein the solenoid 32 is substituted for the coil in the plate circuit of the 3E29 vacuum tube.

The arrangement is such that on the portions 30 of the output wave of the bias switch circuit 28, the electrode 14 is biased in the charge injecting state and the gate 38 is energized to keep the switch 35 open so that no output signal passes therethrough. During this time, a packet of charges is injected into the ring 12. During portions 31 of the output wave of the switch circuit 28, the electrode 14 is biased as a collector electrode and the gate circuit 38 is energized to keep the switch 35 closed. Thus when the injected charges are swept around the crystal by the field induced therein by the sawtooth pulse field and they reach the electrode 14 which is biased in the reverse direction and which acts as a collector electrode, output pulses 42 (Figure 2*d*) appear in the output portion of the system. Thus, the charge carriers are stored in the ring 12 and when received by the collector electrode constitute a delayed output signal which may be employed in any suitable utilization circuit.

In operation of the device 10, as described above, on the positively sloped portions of the sawtooth pulse 20, injected charge carriers are swept in one direction around the crystal. On the negatively sloped portions of the pulses, any charge carriers not collected are swept back around the crystal in the reverse direction. Thus, it is conceivable that fresh charges might be injected before all of the carriers previously injected are disposed of. However, in order for an output pulse to be a true representation of an input pulse, it is desirable that all of the carriers of one input pulse be disposed of before injection by the next input pulse. Thus, it is preferable that the material constituting the semiconductor crystal 12, have a lifetime for minority charge carriers which is shorter than the duration time $t$ (Figure 2*a*) of any one sawtooth pulse 20. Thus the crystal 12 is cleared of any minority charge carriers remaining from any one pulse before additional carriers are injected by the next pulse.

The time $t_x$ for injected charges to traverse a distance $x$ is given by the expression:

$$t_x=\frac{x}{\mu E}$$

where $\mu$=the mobility of the charge carriers and $E$=the electric field intensity.

Thus, the distance traversed around the crystal by charge carriers and the time for traversing the distance may be readily varied by appropriately varying the electric field. Thus, for example, depending on lifetime, the injected charge carriers may be swept around the crystal once, or two or more times, before the rectifying electrode is switched to the collecting state and they are collected. In this way, the time delay between input and output signals may be varied over a wide range.

In addition, the instant at which the electrode 14 becomes a collector may be controlled by generating in the switch circuit 28 a wave (Figure 2*e*) having positive portions 32 which cause the electrode 14 to inject charge carriers and negative portions 34 during which electrode 14 is biased as a collector portion being positioned a predetermined time after the portions 32. Such a wave may be generated as described in the above-mentioned "waveforms" citation. This type of operation may be used in a coincidence counter in which both the passage of charges at electrode 14 and the occurrence of a collecting bias are required for obtaining an output signal.

Figure 3:
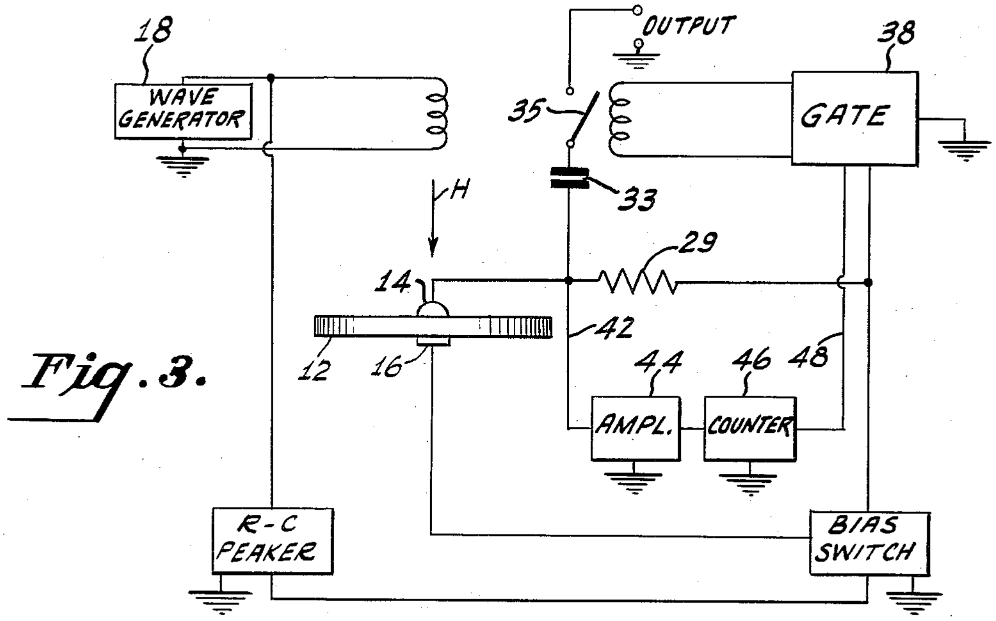
Fig. 3 is a further modification of Fig. 1

The circuit of Figure 1 may be modified as shown in Figure 3 to allow the injected charge carriers to be swept around the crystal more than once. The modified circuit of Figure 3 includes all of the elements of the circuit of Figure 1 and, in addition, a lead 42 from the rectifying electrode 14 to a conventional signal amplifier 44 to a counter circuit 46 the output of which is coupled by a lead 48 to the gate circuit 38.

The counter circuit 46 is selected to add up a predetermined number of pulses and then produce a control or gating pulse to operate the gate circuit 38. Suitable counting circuits are described in chapter 17 of volume 19 entitled "Waveforms" of the MIT Radiation Laboratory Series published by the McGraw-Hill Book Company, Inc. (1949). For example, if it is desired to obtain one output signal from two input pulses, a bistable multivibrator of the type shown on page 605 may be employed. Other counting circuits for obtaining other ratios of input to output pulses may also be found in chapter 17 of "Waveforms."

Figure 4:
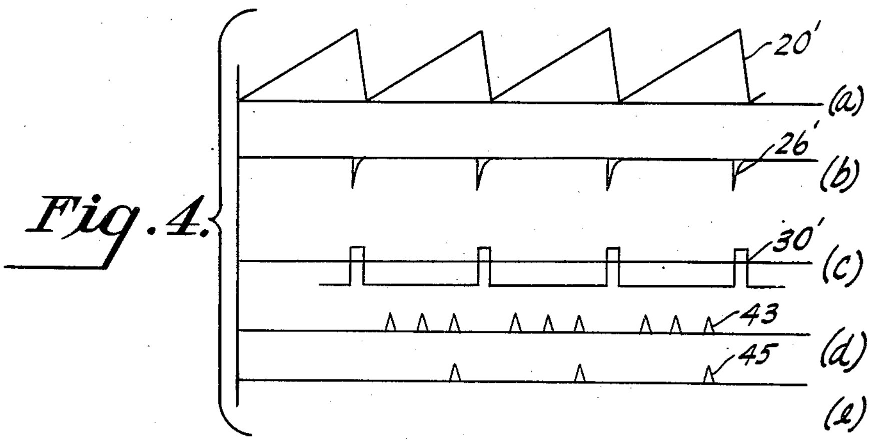
Fig. 4 is a representation of various voltage waves which may be utilized in the circuit of Fig. 3.

In operation of the circuit of Figure 3 and referring to Figure 4, the generator 18 is modified to generate a steep sawtooth wave 20' (Figure 4*a*) which produces such an intense electric field in the crystal 12 that charge carriers injected by the electrode 14 on the positive portions 30 of the wave of Figure 4*c* are swept around the crystal several times during each sawtooth wave. Each time that the charge carriers pass the electrode 14, a signal pulse 43 (Figure 4*d*) is transmitted through the lead 42 and the amplifier 44 to the counter 46 which, after a predetermined number of pulses, for example, three, representing the number of sweeps around the crystal provides a pulse 45 (Figure 4*e*) which energizes the gate 38 to close the switch 35 and pass an output signal.

What is claimed is:

1. A semiconductor device comprising a generally ring-shaped body of semiconductor material providing a closed loop path for current flow, a base electrode in contact with said body, and a single emitter and collector electrode in rectifying contact with said body and comprising the starting point and terminus for current flow in said closed loop path.

2. A semiconductor device comprising a body of semiconductor material having therein a closed loop path for charge carriers, a base electrode in contact with said body, a common emitter and collector electrode in rectifying contact with said body, and means for sweeping an electric field along said path to control the flow of charge carriers along said path, said rectifying electrode being adapted to be switched between current injecting and current collecting states.

3. A semiconductor device comprising a generally ring-shaped body of semiconductor material providing a closed loop path for current flow, a base electrode in contact with said body, and a single emitter and collector electrode in rectifying contact with said body and comprising the starting point and terminus for current flow in said closed loop path, and means for sweeping an electric field along said path to control the flow of charge carriers along said path.

4. Time delay apparatus comprising a semiconductor crystal defining a closed loop path for current flow, first means for injecting current into said crystal, second means for sweeping said current around said crystal to said first means, and third means for biasing said first means in alternate current injecting and current collecting states.

5. Time delay apparatus comprising a semiconductor crystal defining a closed loop path for current flow, first means for injecting current into said crystal, second means for sweeping said current around said crystal to said first means, and third means for biasing said first means in current injecting and current collecting states at controllably variable intervals.

6. Time delay apparatus comprising a body of semiconductor material providing a closed loop path for current flow, a base electrode and a rectifying electrode in contact with said body, a bias switching circuit for biasing said rectifying electrode in current injecting and current collecting states at predetermined intervals, and means for sweeping injected current from said rectifying electrode around said body.

References Cited in the file of this patent

UNITED STATES PATENTS

| | | |
|---|---|---|
| 2,627,575 | Meacham et al. | Feb. 3, 1953 |
| 2,655,607 | Reeves | Oct. 19, 1953 |
| 2,666,816 | Hunter | Jan. 19, 1954 |
| 2,702,316 | Friend | Feb. 15, 1955 |

OTHER REFERENCES

National Bureau of Standards, Technical News Bulletin, vol. 38, October 1954, No. 10, pp. 145–148, Diode Amplifier.